US007495370B1

(12) United States Patent
Porzio

(10) Patent No.: US 7,495,370 B1
(45) Date of Patent: Feb. 24, 2009

(54) HYBRID TRANSDUCER

(75) Inventor: Raymond Porzio, LaFayette, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 151 days.

(21) Appl. No.: 11/417,592

(22) Filed: May 4, 2006

(51) Int. Cl.
*H01L 41/08* (2006.01)

(52) U.S. Cl. ........................ 310/322; 310/325; 367/157

(58) Field of Classification Search ............ 310/323.21, 310/325, 323.12, 323.31, 322; 367/157
See application file for complete search history.

(56) References Cited

U.S. PATENT DOCUMENTS 3,890,591 A * 6/1975 Bocquillon et al. ......... 310/325
5,166,907 A * 11/1992 Newnham et al. ........... 367/157
5,998,908 A * 12/1999 Goodson .................... 310/325
6,653,760 B1 * 11/2003 Goodson .................... 310/325
6,822,373 B1 * 11/2004 Butler ........................ 310/325
6,924,585 B2 * 8/2005 Goodson .................... 310/325
7,112,860 B2 * 9/2006 Saxler ........................ 310/322

* cited by examiner

*Primary Examiner*—Jaydi SanMartin
(74) *Attorney, Agent, or Firm*—Howard IP Law Group, PC

(57) ABSTRACT

A longitudinal vibrator-type transducer including: a head mass; a tail mass; a first piezo-resonator positioned between the head and tail masses; and, a coupling member coupling the head mass, tail mass and first piezo-resonator together; wherein, the head mass comprises a piezoceramic plate.

20 Claims, 5 Drawing Sheets

HYBRID TRANSDUCER

FIELD OF THE INVENTION

The invention relates generally to transducers, and more particularly to transducers suitable for sonar applications.

BACKGROUND OF THE INVENTION

SOund Navigation And Ranging (SONAR) is a technique that uses sound propagation to navigate or to detect other vessels in water. Active sonar transmits a pulse of sound, often called a "ping", and then listens for reflections of the pulse. Distance may be determined using transmission/reception delay. Several hydrophones may be used to measure relative times of arrival to determine a relative bearing using beamforming.

Sonar systems use transducers to transmit and receive sound signals. Previous attempts to optimize response characteristics have used transmit/receive switch and diodes circuits with a common transducer. This has resulted in undesirably complicated and costly systems. Thus, it is desirable to provide a single transducer that is well suited to both transmit and receive signals in sonar applications.

SUMMARY OF THE INVENTION

A longitudinal vibrator-type transducer including: a head mass; a tail mass; a first piezo-resonator positioned between the head mass and tail mass; and, a coupling member coupling the head mass, tail mass and first piezo-resonator together; wherein, the head mass comprises a piezoceramic plate.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts, and.

DETAILED DESCRIPTION OF THE PREFERRED EMBODIMENTS

It is to be understood that the figures and descriptions of the present invention have been simplified to illustrate elements that are relevant for a clear understanding, while eliminating, for the purpose of clarity, many other elements found in typical sonar systems, and methods of making and using the same. Those of ordinary skill in the art may recognize that other elements and/or steps may be desirable in implementing the present invention. However, because such elements and steps are well known in the art, and because they do not facilitate a better understanding of the present invention, a discussion of such elements and steps is not provided herein.

Longitudinal vibrator-type transducers are generally known and used as a transmitter or receiver in sonar applications. Such a transducer generally includes a piezo-resonator, such as a piezo-electric ceramic active element, a head mass, a tail or rear mass and a bias rod. Transducers of this type typically have two or more characteristic frequencies that adversely affect the flatness and phase stability of the receiving response—these include the fundamental half-wave longitudinal resonance frequency, and secondary resonances associated with compliant members and masses, as well as stack and tie rod resonances. This typically results in poor phase stability in the receive response.

A transducer according to one embodiment of the present invention allows for a flattened receive response, and hence improved receive phase stability. Further, it advantageously simplifies associated electronics by eliminating the need for diodes and transmit/receive (T/R) switches.

Figure 1:
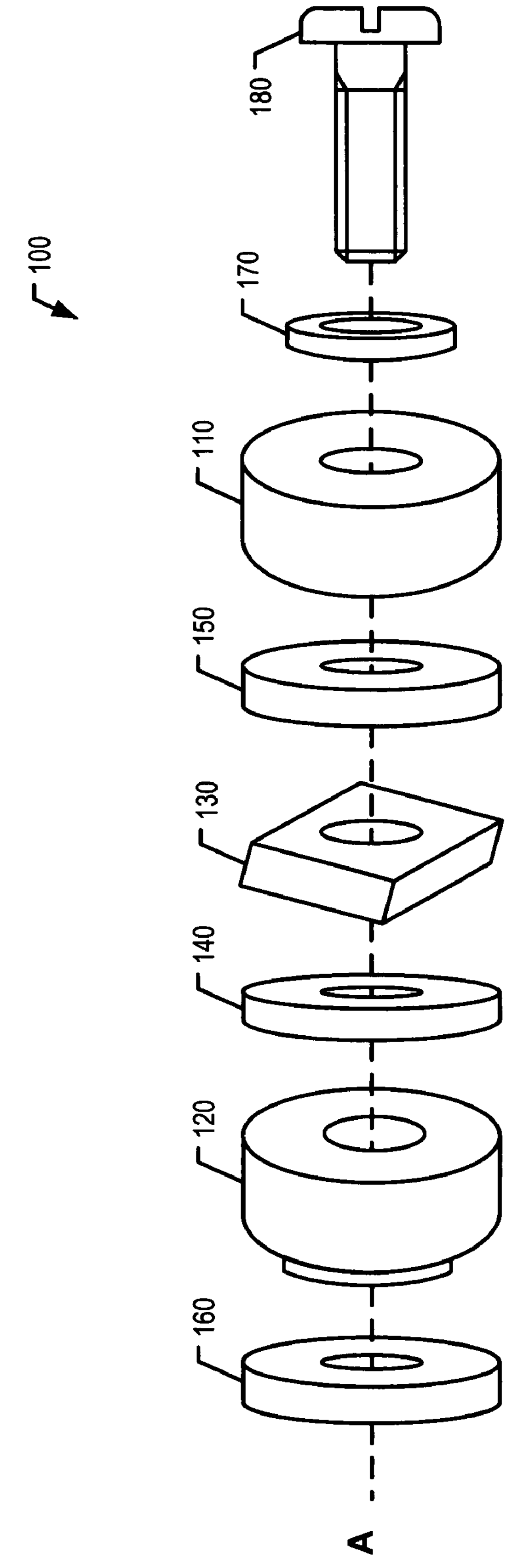
FIG. 1 illustrates an exploded view of a transducer configuration according to an embodiment of the present invention.

Referring now to FIG. 1, there is shown an exploded view of an exemplary transducer configuration, wherein the head mass is composed of a piezoceramic receiver such as a monolithic ceramic disk that acts as both a hydrophone and the head mass for a second ceramic body, which takes the form of a composite tape-cast ceramic stack. Such a configuration is particularly well suited for use in low cost conformal sonar array applications, such as for submarine applications.

The ceramic head mass has a high receive response by virtue of its relatively wide electrode spacing, smoothness and phase stability. The flat receive response with stable phase is achieved by virtue of the high resonance frequency of the head mass ceramic disk, which is well above the intended band of operation. In other words, the ceramic head mass is operated below its resonance frequency to obtain superior receive response uniformity and stability. On the other hand, the tape cast stack (located between the receiver head mass and a tail mass) has a relatively close electrode spacing and a high transmit response, requiring relatively low voltage to achieve full power. It benefits from the location for its function and uses the mass loading of the receiver head to help achieve lower in-band resonance. As is understood by those of ordinary skill in the art, the resonance frequency is given as $f_r=(1/(2*Pi))*(k/m)^{1/2}$.

FIG. 1 illustrates an exploded view of a transducer configuration 100 according to an exemplary embodiment of the present invention. Configuration 100 includes head mass 110 and tail or end mass 120. A piezo-resonator 130 is positioned between head mass 110 and tail mass 120. An insulator 140 is positioned between tail mass 120 and piezo-resonator 130. A dual resonance cushion 150 is positioned between piezo-resonator 130 and head mass 110. A washer 160 is positioned next to tail mass 120, opposite from insulator 140. A washer 170 is positioned next to head mass 110, opposite from cushion 150. In the illustrated embodiment, each of head mass 110, tail mass 120, piezo-resonator 130, insulator 140, cushion 150 and washers 160, 170 include a substantially central aperture. A coupling member 180 couples the head mass, tail mass and piezo-resonator together, along with the other component parts of the transducer. In an exemplary embodiment of FIG. 1, the coupling member comprises a tie-rod 180 positioned through these apertures aligned along axis A to assemble and secure configuration 100. Configuration 100 may be on the order of about 1-1.5 inches long.

Figure 3:
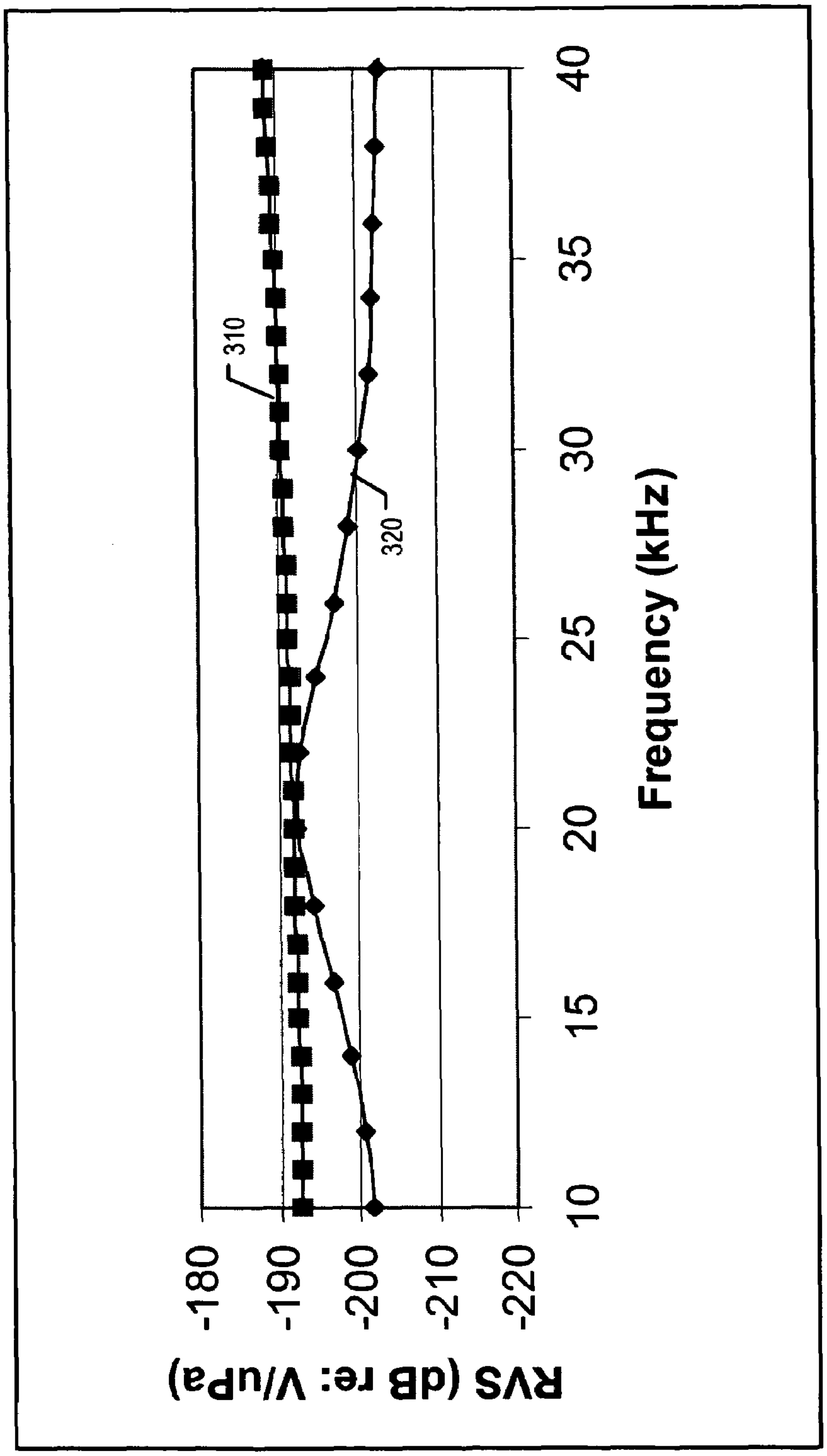
Figure 4:
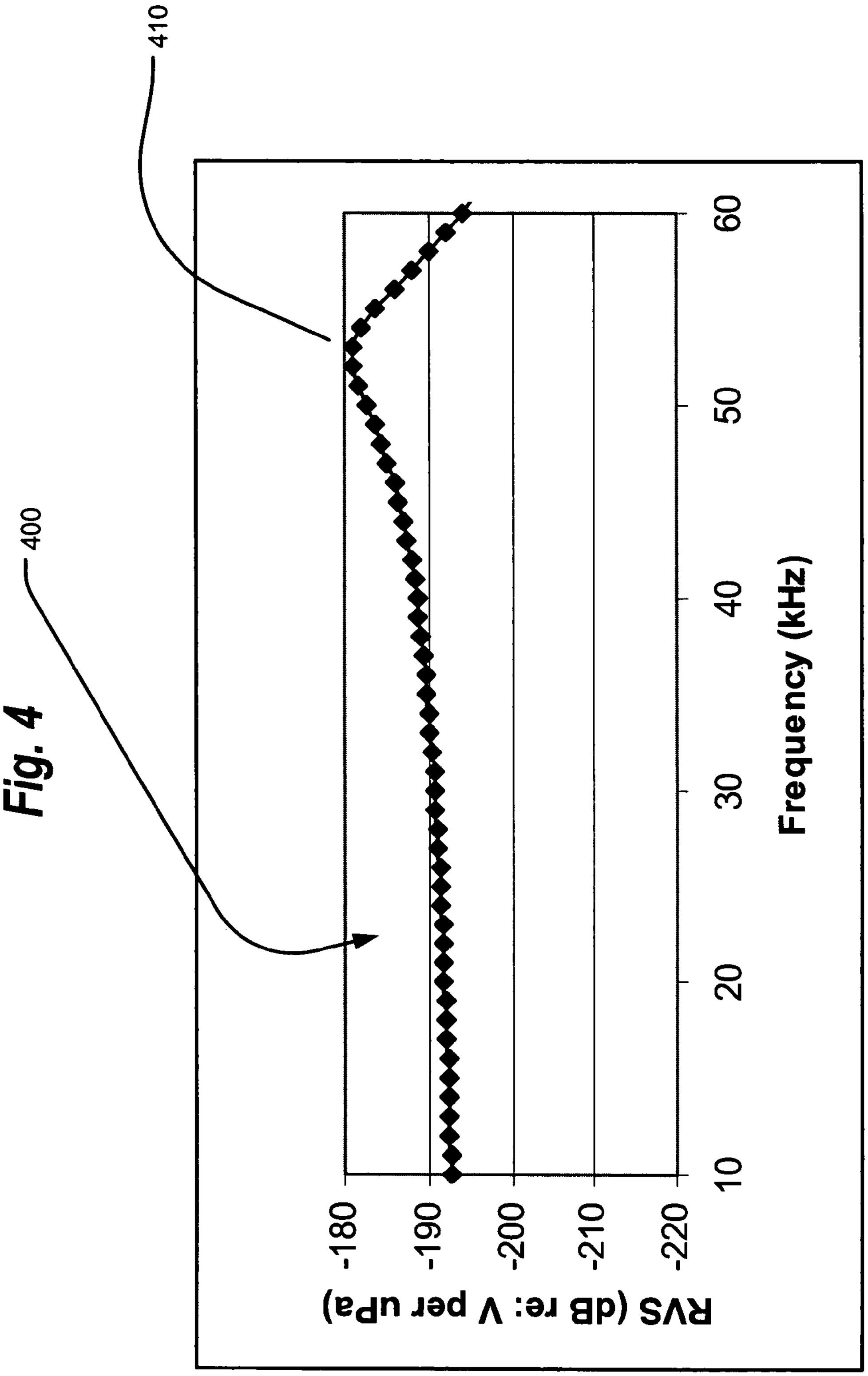
FIG. 4 illustrates a graphical representation of the in-band and above band receive response of a transducer according to an embodiment of the present invention as compared to the in-band receive response of a tape-cast transducer.
Figure 5:
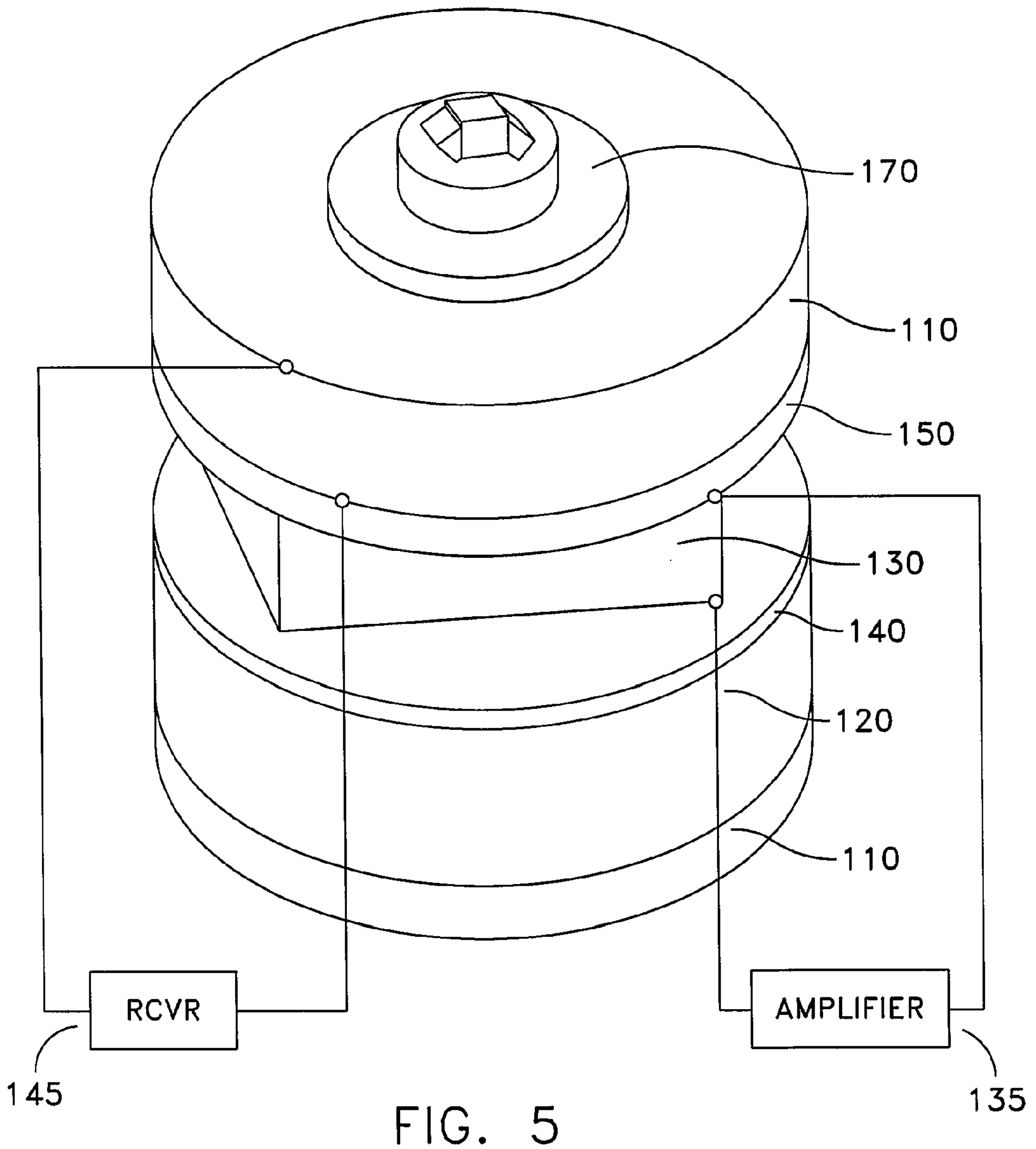
FIG. 5 illustrates an assembled view of the transducer configuration of FIG. 1 including transmit and receive circuitry.

Referring to FIG. 1 in conjunction with FIG. 5, head mass 110 serves as the head mass for piezo-resonator 130. Head mass 110 also serves as the receiving element for receiving acoustic signals, e.g., hydrophone. To facilitate this dual-functionality, head mass 110 may itself take the form of a monolithic ceramic plate or disc. The manufacturing and use of monolithic piezoceramic plates are well known. In one configuration, the ceramic disc may be on the order of 1-2 inches in diameter, and around 0.25 inches in thickness. The disc 110 operative as a receiver and head mass and may be formed of a lead titanate zirconate based composition, such as PZT-4 or PZT-5 (5A, 5H), 8, or other composite piezoceramic. The resonance of such a disc is well above the operational band as can be seen in FIGS. 3-4. Such a ceramic head mass 110 has a flat as well as a high receive response by virtue of its wide electrode spacing and smoothness.

FIG. 5 shows a schematic view of the assembled transducer of FIG. 1, wherein like reference numerals are used to indicate like parts. As shown, the tape cast ceramic piezo resonator 130 is adapted to transmit or project acoustic signals from the transducer via the amplifier/transmit drive circuitry 135 electrically coupled to resonator 130. Such drive circuitry for stimulating piezo resonator 130 is well known and its further description is omitted herein for brevity. The piezo resonator 130 may be formed as a multi layer structure and can be made with tape casting of the films, or deposition onto a substrate with thick film printing, sol-gel deposition, or other deposition techniques. With tape-casting techniques one can typically make films widths of varying thickness. The piezoceramic head mass 110 is adapted to receive acoustic signals (e.g. from an external source, such as an underwater target) for processing via receiver electronic circuitry module 145 electrically coupled to piezoceramic head mass 110. Such receiver circuitry for processing signals is well known and its further description is omitted herein for brevity.

The piezo-resonator 130 may take the form of a laminated, multi-layer, ceramic film piezo-resonator structure, e.g., a tape-cast structure of PZT-4 or PZT-5 materials. The manufacture and use of tape-cast piezo-resonators themselves are known. As compared to monolithic head mass 110, tape-cast structure 130 has a close electrode spacing and a high transmit response. Thus, a relatively low voltage, e.g., around 150V or less, may be used to achieve full transmission power. Positioning of tape-cast structure 130 between head mass 110 and tail mass 120 enables it to use the mass loading of head mass 110 to achieve a low in-band resonance.

Transmit and receive functionality is separately performed by piezo-resonator 130 and head mass 110, respectively, and their operability is independent of one-another. Accordingly, an aspect of the present invention allows that the transmit/receive (T/R) switch circuitry may be advantageously omitted. Thus costs associated with transmit/receive optimized transducers may be advantageously reduced.

Referring again to FIG. 1, tail mass 120 may take the form of a steel annulus. The mass of tail mass 120 may be selected in a conventional manner, taking the mass of head mass 110 into account. Insulator 140 and resonance cushion 150 may each take the form of an annulus-shaped electrical insulator, such as an annulus formed from a conventional grade G-10 material. Dual resonance cushion 150 may also take the form of a fiberglass or composite material, for example. Isolator washer 160 may take the form of an annulus formed of a conventional ceramic backing material, such as a composite of cork and neoprene, e.g., pre-compressed Corprene and operates to decouple the transducer from the mounting structure or backplate. In an exemplary embodiment, washer 170 and tie-rod 180 may each be formed of a metal such as steel. Tie-rod 180 may take the form of a 1 inch long 10-32 steel screw, for example.

Figure 2:
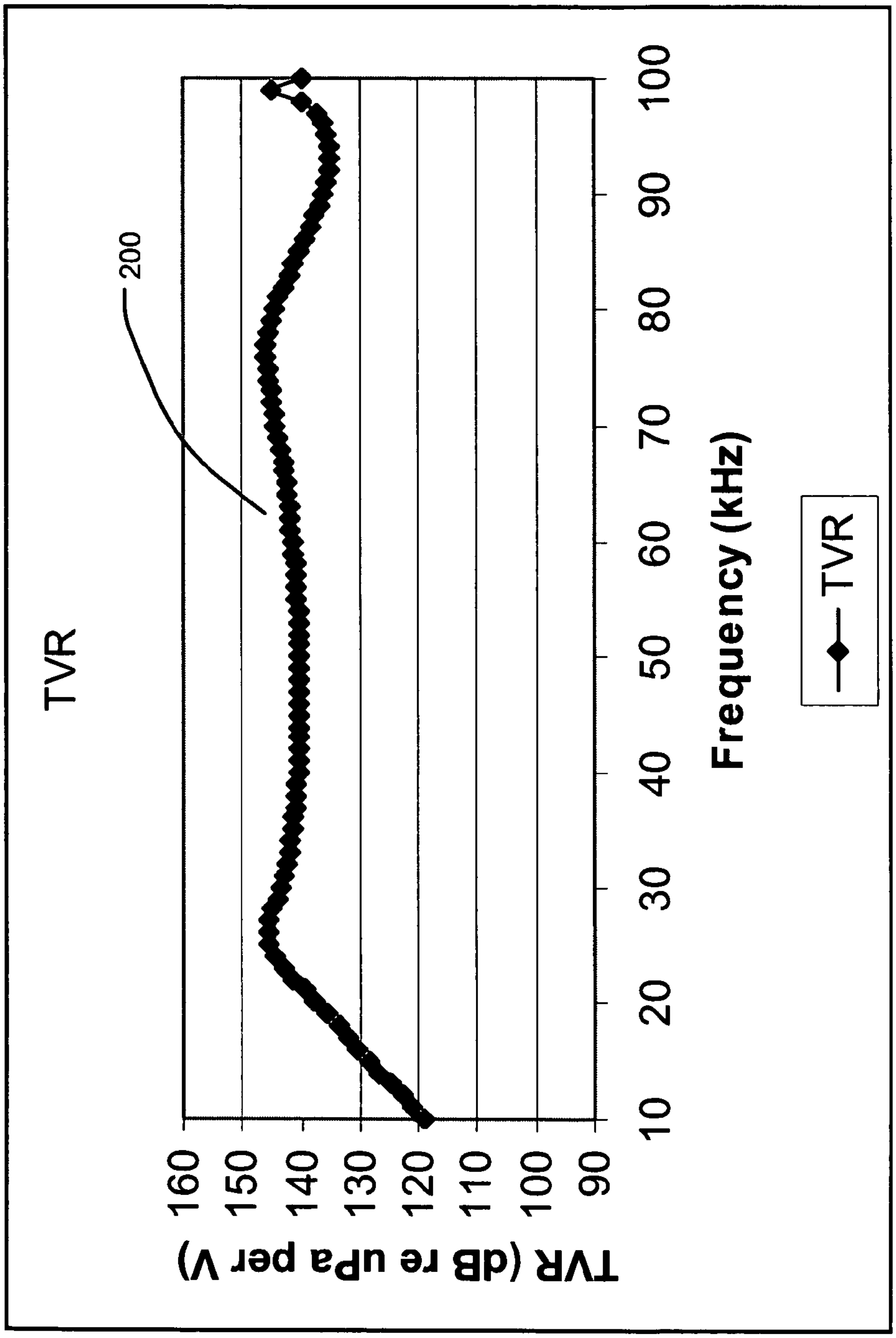
FIG. 2 illustrates a graphical representation of the transmit response of a transducer according to an embodiment of the present invention; and, FIG. 3 illustrates a graphical representation of the in-band receive response of a transducer according to an embodiment of the present invention as compared to the in-band receive response of a tape-cast transducer.

Referring now also to FIG. 2, there is shown a graphical representation of the transmit response of a transducer according to an aspect of the present invention. As can be seen, the transmit response 200 of the piezo-resonator 130 (FIGS. 1, 5) is substantially uniform for frequencies in the range of around 35-60 KHz, with peaks at about 25 KHz and 75 KHz. FIG. 3 shows a graphical representation of the in-band receive response of a transducer according to an aspect of the present invention (performance characteristic 310) as compared to the in-band receive response of a conventional tape-cast transducer (performance characteristic 320). As shown, the configuration embodying the principles of the present invention achieves via piezoceramic head mass receiver 110 (FIGS. 1, 5) a more stable and flat frequency response over a wider frequency range. FIG. 4 illustrates a graphical representation 400 of the in-band and above-band receive response of a transducer configuration including piezoceramic head mass receiver 110 embodying the principles of the present invention. As can be seen, the response peak occurs at a frequency slightly greater than 50 KHz.

Those of ordinary skill in the art may recognize that many modifications and variations of the present invention may be implemented without departing from the spirit or scope of the invention.

What is claimed is:

1. A longitudinal vibrator transducer comprising:

a head mass, said head mass comprising a piezoceramic plate for receiving acoustic signals and converting said signals to electrical waveforms;

a tail mass;

a first piezo-resonator positioned between said head mass and said tail mass for projecting acoustic signals;

a coupling member coupling said head mass, tail mass and first piezo-resonator together;

electronic circuitry coupled to said piezo-resonator for providing an electrical stimulus to said piezo-resonator to cause said piezo-resonator to project said acoustic signals; and electronic circuitry coupled to said piezoceramic plate to receive said electrical waveforms indicative of said acoustic signals;

wherein a mass loading of said head mass is adapted such that the piezo-resonator achieves a low in-band resonance.

2. The transducer of claim 1, wherein said first piezo-resonator comprises a multi-layer structure.

3. The transducer of claim 2, wherein said piezoceramic plate is monolithic.

4. The transducer of claim 3, wherein said piezoceramic plate comprises a lead titanate zirconate based composition.

5. The transducer of claim 3, wherein said coupling member comprises a tie rod, and wherein said head mass, tail mass and first piezo-resonator each comprise a substantially central aperture accommodating said tie-rod.

6. The transducer of claim 3, further comprising at least one cushion between said piezoresonator and said piezoceramic plate.

7. The transducer of claim 6, further comprising at least one insulator between said tail mass and first piezo-resonator.

8. The transducer of claim 7 wherein said coupling member comprises a tie rod, and further comprising at least one washer around said tie-rod.

9. The transducer of claim 7, further comprising a plurality of washers around said tie-rod.

10. The transducer of claim 1, wherein said first piezoresonator comprises a plurality of piezoceramic films.

11. The transducer of claim 10, wherein said films comprise a lead titanate zirconate based composition.

12. A longitudinal vibrator transducer that operates to project acoustic signals in a first mode and to receive acoustic signals in a second mode, said transducer comprising:

a piezoceramic head mass;

a tail mass;

a piezoelectric driver positioned between said head mass and said tail mass and projecting said acoustic signals in response to an electrical stimulus in said first mode;

a coupling member coupling said head mass, tail mass and piezoelectric driver together;

electronic circuitry coupled to said piezoelectric driver for providing an electrical stimulus to said piezoelectric driver to cause said piezoelectric driver to project said acoustic signals;

wherein the piezoceramic headmass receives acoustic signals external to said transducer and converts said received acoustic signals to electrical waveforms in said second mode; and, electronic circuitry coupled to said piezoceramic headmass to receive said electrical waveforms indicative of said acoustic signals.

13. The transducer of claim 12, wherein said piezoelectric driver comprises a multi-layer structure.

14. The transducer of claim 13, wherein said piezoceramic head mass is monolithic.

15. The transducer of claim 14, wherein said piezoceramic head mass comprises a lead titanate zirconate based composition.

16. The transducer of claim 14 wherein said coupling member comprises a tie rod, and wherein said tail mass, piezoelectric driver and piezoceramic head mass each comprise a substantially central aperture accommodating said tie-rod.

17. The transducer of claim 14, further comprising at least one cushion between said piezoelectric driver and piezoceramic head mass.

18. The transducer of claim 17, further comprising at least one insulator between said tail mass and piezoelectric driver.

19. The transducer of claim 12, wherein said piezoelectric driver comprises a plurality of piezoceramic films.

20. The transducer of claim 19, wherein said films comprise a lead titanate zirconate based composition.

* * * * *